United States Patent
Pandey et al.

(10) Patent No.: US 10,033,396 B1
(45) Date of Patent: Jul. 24, 2018

(54) ACTIVE SWITCH HAVING LOW LEAKAGE CURRENT

(71) Applicant: NXP USA, INC., Austin, TX (US)

(72) Inventors: Luv Pandey, Noida (IN); Sanjoy Kumar Dey, Noida (IN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/469,564

(22) Filed: Mar. 26, 2017

(51) Int. Cl.
*H03M 1/06* (2006.01)
*H03M 1/00* (2006.01)
*H03K 17/16* (2006.01)
*H03M 1/38* (2006.01)

(52) U.S. Cl.
CPC .......... *H03M 1/002* (2013.01); *H03K 17/161* (2013.01); *H03M 1/38* (2013.01)

(58) Field of Classification Search
CPC ...... H03M 1/12; H03M 1/0881; H03M 1/466; H03M 1/747; H03M 1/10; H03M 1/1009; H03M 1/00
USPC .......................... 341/150, 155, 172, 136, 144
See application file for complete search history.

(56) References Cited

U.S. PATENT DOCUMENTS

| | | | | |
|---|---|---|---|---|
| 7,015,841 B2* | 3/2006 | Yoshida | .............. | H03M 1/1245 341/120 |
| 7,646,653 B2 | 1/2010 | Choi et al. | | |
| 7,973,570 B2 | 7/2011 | Pigott et al. | | |
| 8,570,205 B2 | 10/2013 | Sarraj et al. | | |
| 2010/0118638 A1* | 5/2010 | Hong | ......................... | G11C 5/14 365/226 |
| 2010/0200781 A1* | 8/2010 | Khorasani | ......... | B01L 3/502715 250/576 |
| 2012/0026027 A1* | 2/2012 | Steensgaard-Madsen | ................ | H03M 1/466 341/161 |
| 2012/0286756 A1* | 11/2012 | Tsukiji | ..................... | H02M 1/32 323/284 |
| 2015/0171885 A1* | 6/2015 | Juang | ...................... | H03M 1/06 341/118 |
| 2016/0081144 A1* | 3/2016 | Lee | ......................... | G09G 3/342 315/186 |
| 2016/0248244 A1* | 8/2016 | Heurtier | .................... | H02H 9/04 |
| 2016/0277019 A1 | 9/2016 | Cical et al. | | |
| 2016/0373109 A1* | 12/2016 | Hwang | .................. | H02M 7/219 |
| 2017/0063369 A1* | 3/2017 | Boakye | ............. | H03K 3/02337 |
| 2017/0294922 A1* | 10/2017 | Illing | ...................... | H03M 1/38 |
| 2017/0330874 A1* | 11/2017 | Robins | ................ | H01L 27/0251 |

* cited by examiner

Primary Examiner — Linh Nguyen
(74) Attorney, Agent, or Firm — Charles E. Bergere

(57) ABSTRACT

In an analog-to-digital converter (ADC) having storage capacitors, active, top-plate, n-type, switch circuitry has an n-type transistor and gate-voltage control circuitry that generates the gate voltage to turn on and off the transistor. The control circuitry turns off the transistor by generating the gate voltage at a level that limits the gate-to-source voltage difference, thereby limiting GISL leakage current through the transistor that can otherwise jeopardize the accuracy of the ADC digital output value. In one implementation, when the transistor is to be off (for example, during the ADC conversion phase), the control circuitry generates the gate voltage to be at ground if the source voltage is below a reference voltage, and above ground if the source voltage is above the reference voltage. The switch circuitry can also be implemented using a p-type device or a transmission gate instead of the n-type device.

9 Claims, 5 Drawing Sheets

100

200

300

310

310

330

| sw_en | 312 | ph0 | ph1 | ph2 | ph3 | V_G |
|---|---|---|---|---|---|---|
| 1 | 0 | 0 | 0 | 1 | 0 | VDD |
| 0 | 0 | 1 | 1 | 1 | 0 | 0 |
| 0 | 1 | 1 | 0 | 0 | 1 | Vx |

ACTIVE SWITCH HAVING LOW LEAKAGE CURRENT

BACKGROUND

The present invention relates to electronic switches and, more particularly, to electronic switches for switched capacitor circuitry used in analog-to-digital converters.

A successive-approximation-register (SAR) analog-to-digital converter (ADC) selectively stores analog input energy in storage capacitors and then successively taps that energy to convert an analog input voltage into a representative digital output value.

FIG. 1 is a schematic circuit diagram of a portion of a conventional 3-bit SAR ADC 100 having four storage capacitors Cs0, Cs1, Cs2, and Cs3 having relative capacitance levels of Cu, Cu, 2Cu, and 4Cu, respectively. The SAR ADC 100 also has top-plate sampling switch STP, four bottom-plate sampling switches Sin0-Sin3, and eight bottom-plate conversion switches Sw10-Sw13 and Sw20-Sw23. Note that the top plates of the four storage capacitors Cs0-Cs3 are all shorted together at top-plate node TP, while each storage capacitor Csi has its own distinct bottom-plate node Bpi.

The switch STP selectively connects the top-plate node to a common-mode reference voltage Vcm, the switches Sin0-Sin3 selectively connect the corresponding bottom-plate nodes BP0-BP3 to the input voltage Vin, the switches Sw10-Sw13 selectively connect the corresponding bottom-plate nodes BP0-BP3 to a high reference voltage Vrh, and the switches Sw20-Sw23 selectively connect the corresponding bottom-plate nodes BP0-BP3 to a low reference voltage Vrl. In this specification, it will be assumed that Vrl is at ground (i.e., 0V), Vrh is at the supply voltage VDD, Vcm is at VDD/2, and Vin can be at any voltage level from 0V to VDD. Those skilled in the art will understand that other implementations may involve different voltage levels for one or more of these analog signals.

The SAR ADC 100 has two operational phases: a sampling phase during which the input voltage Vin is sampled and electrical energy (in the form of charge) is stored in the storage capacitors Cs0-Cs3 and a conversion phase during which the stored energy in each of the storage capacitors Cs0-Cs3 is successively evaluated to generate the representative digital output value.

During the sampling phase, the sampling switches STP and Sin0-Sin3 are closed and the conversion switches Sw10-Sw13 and Sw20-Sw23 are open. As such, during the sampling phase, the top-plate node TP is driven to Vcm through the switch STP and the bottom-plate nodes BP0-BP3 are all driven to Vin through the switches Sin0-Sin3.

At the end of the sampling phase, the sampling switches STP and Sin0-Sin3 are all open, thereby (ideally) "freezing" the amount of energy (i.e., charge) stored in each of the storage capacitors Cs0-Cs3. As such, the voltage stored across each of the storage capacitors Cs0-Cs3 will (ideally) be fixed at the difference (Vcm-Vin) between the common-mode reference voltage Vcm and the input voltage Vin.

During the conversion phase, with the sampling switches STP and Sin0-Sin3 open, the conversion switches Sw10-Sw13 and Sw20-Sw23 are controlled to successively evaluate the energy stored in each of the storage capacitors Cs0-Cs3. During the conversion phase, depending on the voltage level of Vin during the sampling phase, the top-plate node TP will be driven somewhere between 0V and VDD. For example, when Vin=VDD, the node TP will be driven to 0V during the conversion phase; when Vin=VDD/2, the node TP will be driven to VDD/2 during the conversion phase; and, when Vin=0V, the node TP will be driven to VDD during the conversion phase.

It is known to implement the top-plate sampling switch STP using an n-type MOSFET (metal-oxide semiconductor, field-effect transistor) device, a p-type MOSFET device, or a transmission gate having an n-type MOSFET device and a p-type MOSFET device connected in parallel.

FIG. 2 is a schematic diagram of a conventional four-terminal, n-type MOSFET device 200 having a gate G, a source S, a drain D, and a body (or bulk) terminal B. There is an inherent diode relationship between the drain D and the body terminal B that ideally prevents current from flowing from the drain D to the body terminal B. Similarly, there is an inherent diode relationship between the source S and the body terminal B that ideally prevents current from flowing from the source S to the body terminal B.

Nevertheless, when an actual device 200 is biased in the off/accumulation region, significant drain-to-body leakage current (a.k.a. GIDL) and significant source-to-body leakage current (a.k.a. GISL) can be observed, even for drain/source biases much lower than the device's breakdown voltage. The GIDL leakage current has a strong dependence on the drain-to-body voltage $V_{DB}$ and the drain-to-gate bias voltage $V_{DG}$. As $V_{DB}$ and/or $V_{DG}$ increases, the GIDL leakage current increases exponentially. Similarly, the GISL leakage current has a strong dependence on the source-to-body voltage $V_{SB}$ and the source-to-gate bias voltage $V_{SG}$. As $V_{SB}$ and/or $V_{SG}$ increases, the GISL leakage current increases exponentially.

Note that p-type MOSFET devices are also susceptible to GIDL and GISL leakage currents. For n-type devices, the GIDL leakage current is highest when the drain voltage reaches the highest voltage (i.e., VDD), and the GISL leakage current is highest when the source voltage reaches the highest voltage. For p-type devices, on the other hand, the GIDL leakage current is highest when the drain voltage reaches the lowest voltage (i.e., ground or zero volts), and the GISL current is highest when the source voltage reaches the lowest voltage. Note that, a transmission gate having both an n-type device and a p-type device will exhibit high GIDL/GISL leakage currents at both VDD and at zero voltage.

When the top-plate sampling switch STP of FIG. 1 is implemented using an n-type MOSFET, like the device 200 of FIG. 2, the device's drain D is connected to the reference voltage Vcm, the device's body terminal B is connected to ground, the device's source S is connected to the top-plate node TP, and the device's gate G is connected to control circuitry (not shown in FIG. 1) that turns on the device 200 (i.e., closes the switch STP) and turns off the device 200 (i.e., opens the switch STP).

During the conversion phase with the switch STP open, the top plate TP of the storage capacitor Cs is undriven. If there is any charge leakage, such as the charge leakage associated with GIDL and/or GISL leakage current, through the open switch STP, then the energy stored in the storage capacitors Cs0-Cs3 will change, which can adversely affect the accuracy of the digital output value generated by the ADC.

It would be advantageous to provide switch circuitry for the top-plate sampling switch STP of FIG. 1 that has reduced leakage current.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative embodiments of the invention are disclosed herein. However, specific structural and functional details disclosed herein are merely representative for purposes of describing example embodiments of the invention. The invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention comprises switch circuitry. The switch circuitry comprises a transistor having a gate connected to receive a gate voltage, a first channel terminal, a second channel terminal connected to receive a second-channel-terminal voltage, and a body terminal; and gate-voltage control circuitry that generates the gate voltage to turn on and off the transistor. The gate-voltage control circuitry turns off the transistor by generating the gate voltage at a level that limits voltage difference between the gate voltage and the second-channel-terminal voltage, thereby limiting leakage current through the transistor.

Figure 1:
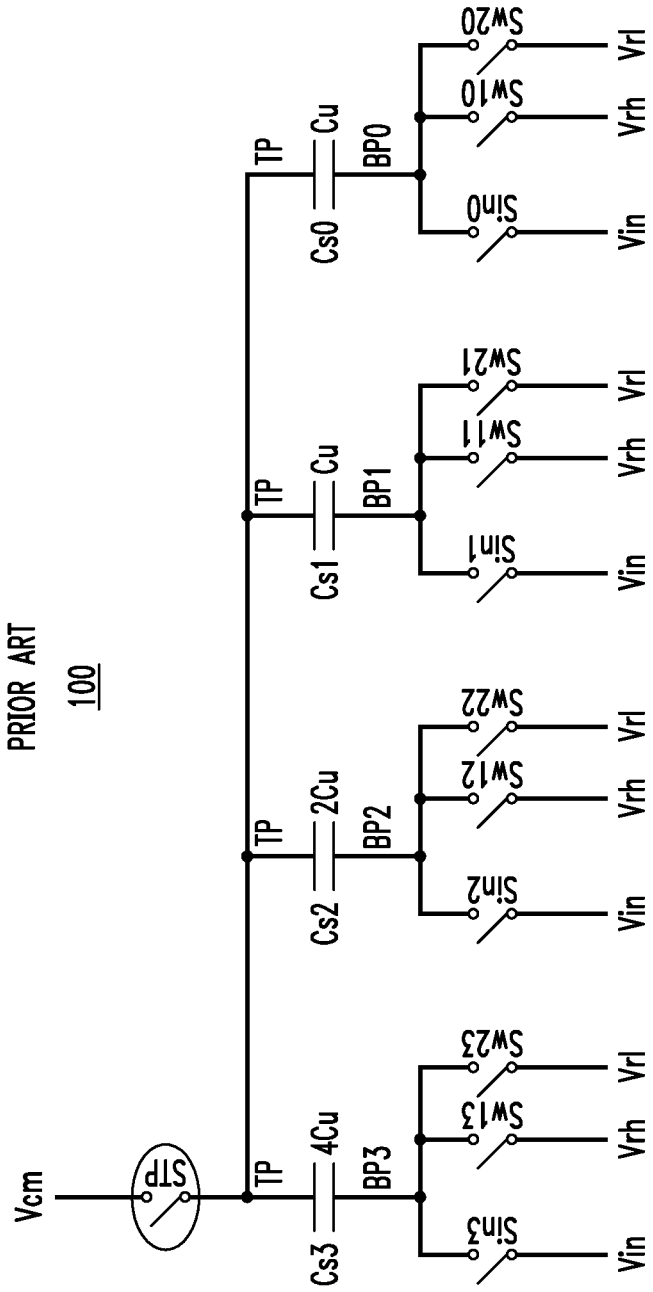
FIG. 1 is a schematic circuit diagram of a portion of a conventional 3-bit SAR ADC.
Figure 2:
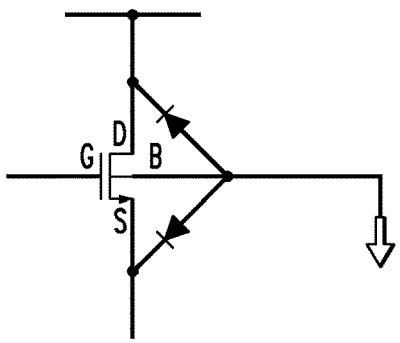
FIG. 2 is a schematic diagram of a conventional four-terminal, n-type MOSFET device.
Figure 3:
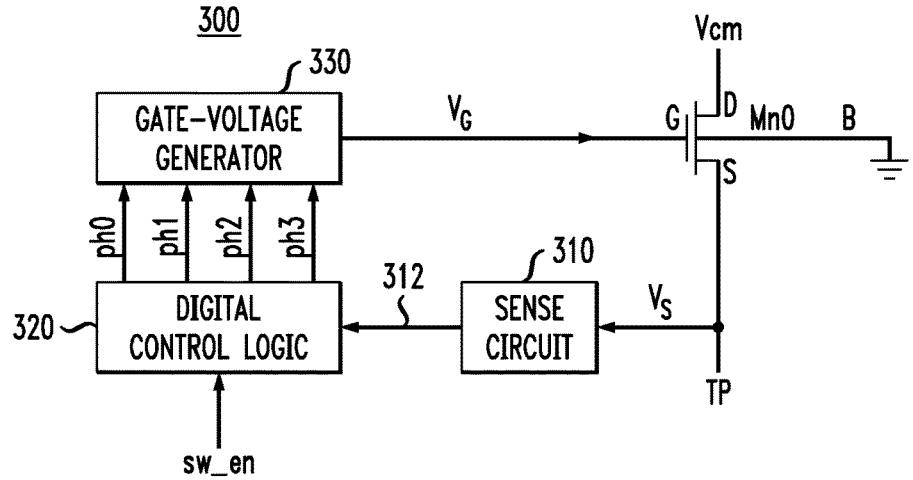
FIG. 3 is a schematic block diagram showing n-type switch circuitry that can be used to implement the top-plate sampling switch STP of FIG. 1, according to one embodiment of the present invention.

Referring now to FIG. 3, a schematic block diagram showing n-type switch circuitry 300 that can be used to implement the top-plate sampling switch STP of FIG. 1, according to one embodiment of the present invention, is shown. The switch circuitry 300 comprises a n-type, four-terminal, MOSFET transistor Mn0, and gate-voltage control circuitry including a sense circuit 310, digital control logic 320, and a gate-voltage generator 330.

When used to implement the switch STP of FIG. 1, the drain terminal D of the transistor Mn0 is connected to the common-mode reference voltage Vcm (e.g., VDD/2), the transistor's gate terminal G is connected to the output of the gate-voltage generator 330, the transistor's body terminal is connected to ground (e.g., 0V), and the transistor's source terminal S is connected both to the top-plate node TP of FIG. 1 and to the input of the sense circuit 310. As such, the transistor's drain voltage $V_D$ will always be at the common-mode voltage Vcm, the gate voltage $V_G$ is generated by the gate-voltage generator 330, and the source voltage $V_S$ will be the same as the voltage at the ADC's top-plate node TP.

Figure 4:
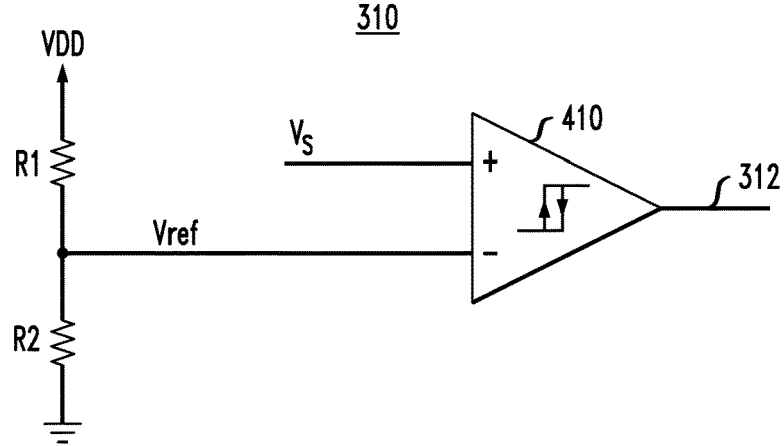
FIG. 4 is a schematic circuit diagram of one possible implementation of the sense circuit of FIG. 3.

The sense circuit 310 senses the source voltage Vs and generates a 1-bit control signal 312 that indicates whether or not the sensed source voltage Vs is greater than a reference voltage Vref (see FIG. 4). Note that the reference voltage Vref may be different from the common-mode reference voltage Vcm.

The digital control logic 320 receives the control signal 312 from the sense circuit 310 and a 1-bit switch control signal sw_en that indicates whether the switch circuitry 300 is to be on (i.e., closed) or off (i.e., open) and generates a 4-bit control signal 322 comprising bits ph0-ph3 that are applied to control the gate-voltage generator 330.

As described previously, after the device Mn0 is turned off by driving the gate voltage $V_G$ low, the GIDL/GISL leakage current through the device Mn0 is dependent on the transistor's gate-to-source voltage $V_{GS}$ and the gate-to-drain voltage $V_{GD}$. When the top-plate node TP, which is shorted to the source terminal S, is driven to a relatively low voltage level (e.g., at or near 0V) during the ADC conversion phase, the gate-to-source voltage $V_{GS}$ will be sufficiently low to limit the GISL leakage current through the transistor Mn0 to a relatively low level.

However, when the top-plate node TP is driven to a relatively high voltage level (e.g., at or near VDD) during the ADC conversion phase, the sense circuit 310, the digital control logic 320, and the gate-voltage generator 330 operate to ensure that the gate voltage $V_G$ is at a suitable, non-zero voltage level in order to limit the gate-to-source voltage $V_{GS}$ and thereby limit the GISL leakage current through the transistor Mn0 to a relatively low level, while still ensuring that the transistor Mn0 remains off (i.e., non-conducting). Without this operation, the GISL leakage current through the transistor Mn0 could be sufficiently high to adversely affect the accuracy of the digital output value generated by the ADC 100 of FIG. 1.

FIG. 4 is a schematic circuit diagram of one possible implementation of the sense circuit 310 of FIG. 3. A comparator 410 (with hysteresis) compares the source voltage $V_S$ of Mn0 with the reference voltage Vref generated by a voltage divider formed by resistors R1 and R2. In general (and ignoring the effects of hysteresis), if the source voltage $V_S$ is greater than the reference voltage Vref, then the comparator output signal (i.e., control signal 312) will be high (i.e., logic 1); otherwise, the comparator output signal 312 will be low (i.e., logic 0). The comparator's hysteresis prevents the control signal 312 from undesirably toggling when the source voltage $V_S$ and the reference voltage Vref are substantially equal for relatively long periods of time.

Figure 5:
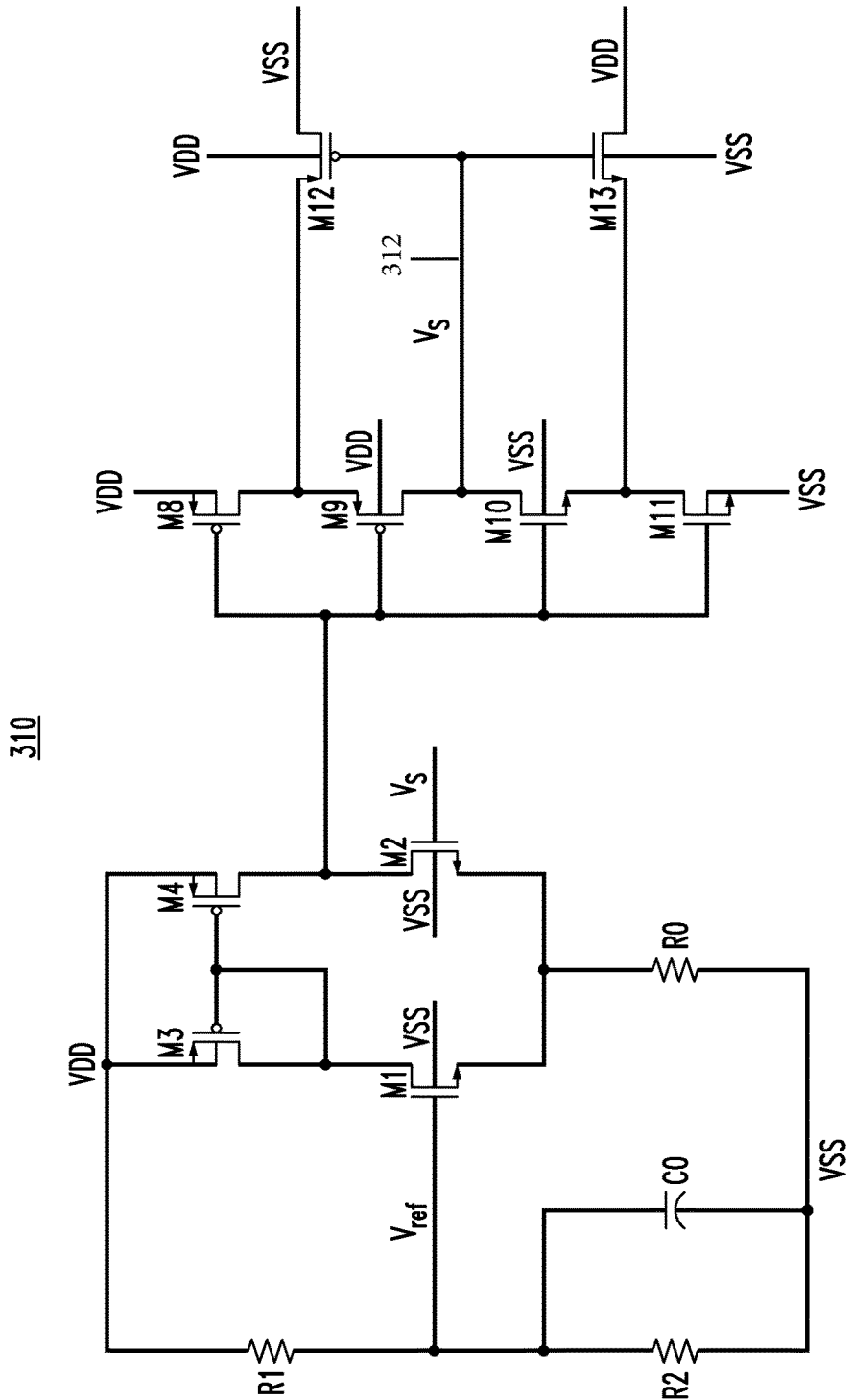
FIG. 5 is a transistor-level circuit diagram of the implementation of the sense circuit of FIG. 4.

FIG. 5 is a transistor-level circuit diagram of the implementation of the sense circuit 310 of FIG. 4. Those skilled in the art will understand that, in FIG. 5, the sense circuit 310 is implemented as a differential pair with current mirror as active load to work as a sense amplifier. The Vs input is applied to the gate of transistor M2, and output on line 312, which is connected at one end to a node on a line connecting the drains of transistors M9 and M10 and at the other end to a node on the line connecting the gates of transistors M12 and M13.

Figure 6:
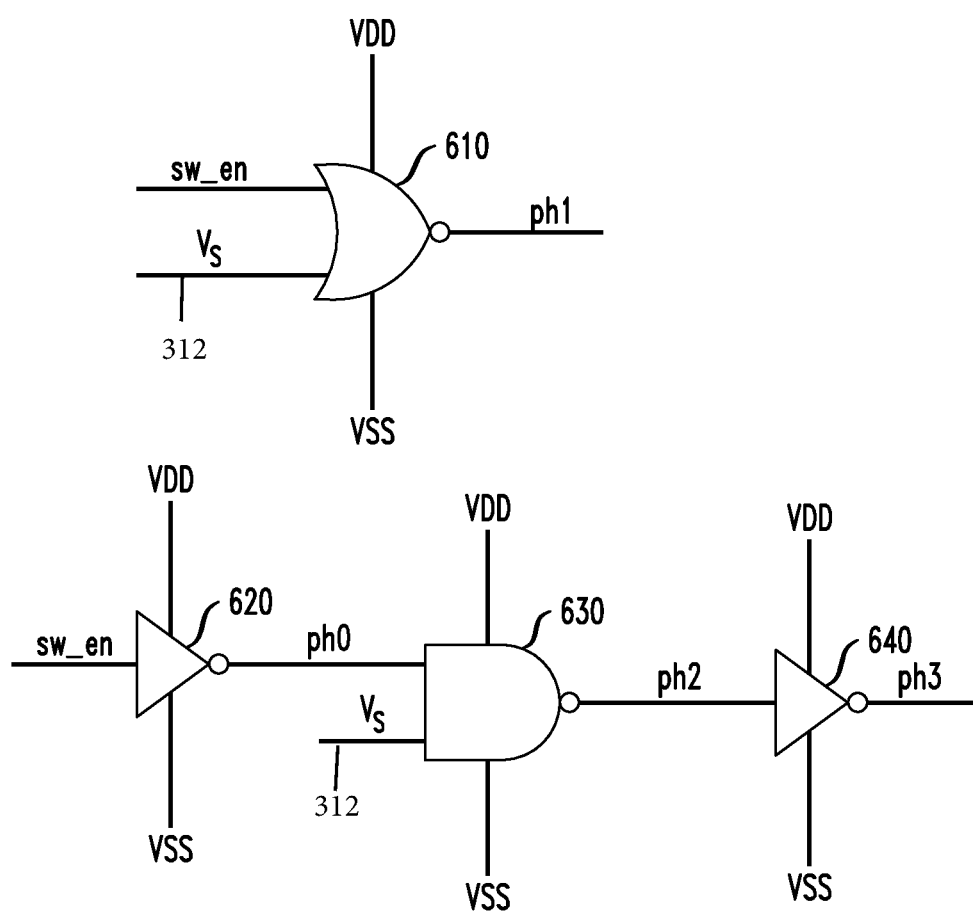
FIG. 6 is a schematic circuit diagram of one possible implementation of the digital control logic of FIG. 3.

FIG. 6 is a schematic circuit diagram of one possible implementation of the digital control logic 320 of FIG. 3. In this implementation, the control logic 320 comprises a NOR gate 610, first inverter 620, NAND gate 630 and a second inverter 640. When control signals sw_en and 312 of FIG. 3 are both at logic 0, then the bit ph1 (i.e., the output of the NOR gate 610) is at logic 1; otherwise, the bit ph1 is at logic 0. When the control signal sw_en is at logic 0, then the bit ph0 (i.e., the output of the inverter 620) is at logic 1; otherwise, the bit ph0 is at logic 0. When the bit ph0 and the control signal 312 are both at logic 1, then the bit ph2 (i.e., the output of the NAND gate 630) is at logic 0; otherwise, the bit ph2 is at logic 1. When the bit ph2 is at logic 0, then the bit ph3 (i.e., the output of the inverter 640) is at logic 1; otherwise, the bit ph3 is at logic 0.

Figures 7, 8:
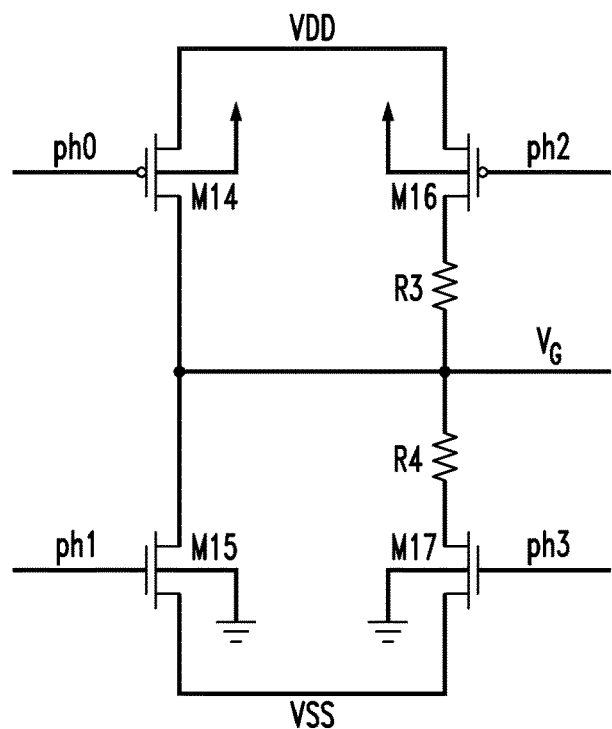
FIG. 7 is a transistor-level circuit diagram of one possible implementation of the gate-voltage generator of FIG. 3.
FIG. 8 is a table that represents the operations of the switch circuitry of FIG. 3 for different situations.

FIG. 7 is a transistor-level circuit diagram of one possible implementation of the gate-voltage generator 330 of FIG. 3, comprising two p-type MOSFET transistor devices M14 and M16, two n-type MOSFET transistor devices M15 and M17, and two resistors R3 and R4.

FIG. 8 is a table that represents the operations of the switch circuitry 300 for different situations.

The first row of the table represents the situation when the switch circuitry is on. In that case, the switch enable control signal sw_en is at logic 1, and the digital control logic 320 generates the 4-bit control signal 322 to have the bit values ph0=ph1=ph3=0 and ph2=1, independent of the value of the control signal 312. As such, the device M14 of FIG. 7 will be on, the other three devices M15, M16, and M17 will be off, and the voltage-signal generator 330 will generate a gate voltage $V_G$ of VDD, which will turn on the device Mn0.

The second row of the table of FIG. 8 represents the situation when the switch circuitry is off (i.e., sw_en is at logic 0) and the source voltage $V_S$ is less than the reference voltage Vref of FIG. 4. In that case, the comparator 410 generates the control signal 312 at logic 0, and the digital control logic 320 generates the 4-bit control signal 322 having the bit values ph0=ph1=ph2=1 and ph3=0. As such, the device M15 of FIG. 7 will be on, the other three devices M14, M16, and M17 will be off, and the voltage-signal generator 330 will generate a gate voltage $V_G$ of VSS (e.g., 0V), which will turn off the device Mn0. Since the source voltage $V_S$ is relatively low (i.e., less than Vref), the gate-to-source voltage $V_{GS}$ will also be relatively low, and the GISL leakage current through the device Mn0 will also be low.

The third row of the table of FIG. 8 represents the situation when the switch circuitry is off (i.e., sw_en is at logic 0) and the source voltage $V_S$ is greater than the reference voltage Vref of FIG. 4. In that case, the comparator 410 generates the control signal 312 at logic 1, and the digital control logic 320 generates the 4-bit control signal 322 having the bit values ph0=ph3=1 and ph1=ph2=0. As such, the devices M16 and M17 of FIG. 7 will be on, the other two devices M14 and M15 will be off, and the voltage-signal generator 330 will generate a gate voltage $V_G$ of $V_X$ between 0V and VDD as determined by the voltage divider formed by the resistors R3 and R4, where $V_X$ is designed to be low enough to keep the device Mn0 off, but high enough to keep the gate-to-source voltage $V_{GS}$ sufficiently low such that the GISL leakage current through the device Mn0 will also be low.

Without the ability of the switch circuitry 300 to selectively generate a non-zero gate voltage $V_G$ of $V_X$, the gate-to-source voltage $V_{GS}$ of Mn0 would sufficiently high when the source voltage $V_S$ is at or near VDD during the ADC's conversion phase that the GISL leakage current through Mn0 could be high enough to adversely affect the accuracy of the ADC's digital output value. The switch circuitry 300 is designed to avoid that result.

Note that, since the drain voltage $V_D$ is always at Vcm, the GIDL leakage-current through Mn0 will be relatively low no matter whether the gate voltage $V_G$ is at or near 0V or at or near VDD.

Although the invention has been described in the context of the switch circuitry 300 of FIG. 3 which has gate-voltage control circuitry (i.e., the sense circuit 310, the digital control logic 320, and the gate-voltage generator 330) that can selectively generate one of three different voltage levels for the gate voltage $V_G$, in other embodiments, the gate-voltage control circuitry can selectively generate more than three different gate-voltage levels, including embodiments that generate continuously different gate-voltage levels rather than a specified number of discrete gate-voltage levels.

Although the invention has been described in the context of the n-type switch circuitry 300 of FIG. 3 which has the n-type MOSFET device Mn0, the invention is not so limited. In other embodiments, switch circuitry of the invention can be implemented using a p-type MOSFET device or a transmission gate instead of the n-type MOSFET device. For p-type switch circuitry in which the p-type device's source terminal is connected to Vcm and the device's drain terminal is connected to the top-plate node TP, the gate-voltage generator is designed to selectively lower the gate voltage $V_G$ from VDD when the drain voltage $V_D$ is relatively low (i.e., below a specified reference voltage) to limit the device's gate-to-drain voltage $V_{GD}$ in order to limit the GIDL leakage current through the device, while still keeping the device turned off. Switch circuitry having a transmission gate can be implemented by combining that p-type switch circuitry with the n-type switch circuitry 300 of FIG. 3.

Although the invention has been described in the context of switch circuitry for SAR ADCs, the invention is not so limited. In general, switch circuitry of the invention can be used in any suitable application to reduce GIDL/GISL leakage currents, including other types of ADCs, Programmable Gain Amplifiers (PGAs), and any other suitable switch-cap circuit. Switch circuitry of the invention may be employed in a variety of different articles of manufacture including consumer electronics products, such as computers and telephones.

Unless explicitly stated otherwise, each numerical value and range should be interpreted as being approximate as if the word "about" or "approximately" preceded the value or range.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding terminals, nodes, ports, or paths may be referred to by the same name and are interchangeable for purposes here.

Transistor devices are typically shown as individual transistors for illustrative purposes. However, it is understood by those with skill in the art that transistor devices will have various sizes (e.g., gate width and length) and characteristics (e.g., threshold voltage, gain, etc.) and may consist of multiple transistors coupled in parallel to get desired electrical characteristics from the combination. Further, the illustrated transistor devices may be composite transistors.

As used in this specification and claims, the term "channel terminal" refers generically to either the source or drain of a MOSFET transistor device. Similarly, as used in the claims, the terms "source," "drain," and "gate" should be understood to refer respectively either to the source, drain, and gate of a MOSFET or to the emitter, collector, and base of a bi-polar device if an embodiment of the invention is implemented using bi-polar transistor technology.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. An analog-to-digital converter (ADC), comprising switch circuitry connected between an ADC voltage reference and ADC storage capacitors, wherein the switch circuitry comprises:
   a transistor device having a gate terminal connected to receive a gate voltage, a first channel terminal connected to a common-mode reference voltage, a second channel terminal connected to receive a second-channel-terminal voltage, and a body terminal connected to ground; and
   gate-voltage control circuitry that generates the gate voltage to turn on and off the transistor device, wherein the gate-voltage control circuitry turns off the transistor device by generating the gate voltage at a level that limits voltage difference between the gate voltage and the second-channel-terminal voltage to control OFF-state leakage of the transistor device, thereby limiting leakage current through the transistor device, and
   wherein the gate-voltage control circuitry comprises:
      a sense circuit that compares the second-channel-terminal voltage to a reference voltage and generates a comparison signal indicating the comparison result;
      digital control logic that generates a multi-bit control signal based on the comparison signal and a switch-enable control signal; and
      a gate-voltage generator that generates the gate voltage based on the multi-bit control signal, and wherein the sense circuit comprises:
         a comparator with hysteresis that receives the second-channel-terminal voltage and the reference voltage, and generates the comparison signal; and
         a voltage divider comprising a plurality of resistors for generating the reference voltage,
      wherein the hysteresis prevents the comparison signal from toggling when the second-channel-terminal voltage and the reference voltage are substantially equal.

2. The ADC of claim 1, wherein:
   the transistor device is an n-type device;
   the first channel terminal is the drain terminal of the transistor device;
   the second channel terminal is the source terminal of the transistor device; and
   the gate-voltage control circuitry generates the gate voltage at a non-ground level when the source voltage of the transistor device is at or near a supply voltage for the switch circuitry.

3. The ADC of claim 2, wherein the gate-voltage control circuitry generates the gate voltage at a ground level when the source voltage of the transistor device is not at or near the supply voltage.

4. The ADC of claim 3, wherein:
   the gate-voltage control circuitry compares the source voltage of the transistor device to a reference voltage;
   the gate-voltage control circuitry generates the gate voltage at the ground level, if the gate-voltage control circuitry determines that the source voltage of the transistor device is below the reference voltage; and
   the gate-voltage control circuitry generates the gate voltage at the non-ground level, if the gate-voltage control circuitry determines that the source voltage of the transistor device is above the reference voltage.

5. The ADC of claim 1, wherein:
   the transistor device is an n-type device;
   the first channel terminal is the drain terminal of the transistor device;
   the second channel terminal is the source terminal of the transistor device;
   the sense circuit compares the source voltage of the transistor device to the reference voltage and generates the comparison signal indicating the comparison result;
   the gate-voltage generator generates the gate voltage at a supply level for the switch circuitry if the digital control logic determines that the switch-enable control signal indicates that the transistor device is to be on;
   the gate-voltage generator generates the gate voltage at a ground level for the switch circuitry if the digital control logic determines that the switch-enable control signal indicates that the transistor device is to be off and if the sense circuit determines that the source voltage of the transistor device is below the reference voltage; and
   the gate-voltage generator generates the gate voltage at a non-ground level if the digital control logic determines that the switch-enable control signal indicates that the transistor device is to be off and if the sense circuit determines that the source voltage of the transistor device is above the reference voltage.

6. The ADC of claim 1, wherein the ADC is a successive-approximation-register (SAR) ADC.

7. The ADC of claim 1, wherein the comparator comprises a differential transistor pair with a current mirror as an active load.

8. The ADC of claim 1, wherein the digital control logic comprises:
   a first inverter that receives the switch-enable control signal and generates a first bit of the multi-bit control signal (ph0);
   a NOR gate that receives the switch-enable control signal and the second-channel-terminal voltage, and generates a second bit of the multi-bit control signal (ph1);
   a NAND gate that receives the first bit of the multi-bit control signal and the second-channel-terminal voltage, and generates a third bit of the multi-bit control signal (ph2); and
   a second inverter that receives the third bit of the multi-bit control signal and generates a fourth bit of the multi-bit control signal (ph3).

9. The ADC of claim 8, wherein the gate-voltage generator comprises:
   a first p-type MOSFET transistor (M14) having a gate that receives the first bit of the multi-bit control signal (ph0);
   a first n-type MOSFET transistor (M15) having a gate that receives the second bit of the multi-bit control signal (ph1), a drain connected to a drain of the first p-type MOSFET transistor, a source connected to ground, and a body connected to ground;
   a second p-type MOSFET transistor (M16) having a gate that receives the third bit of the multi-bit control signal (ph2), and a source connected to a source of the first p-type MOSFET transistor device (M14);
   a second n-type MOSFET transistor (M17) having a gate that receives the fourth bit of the multi-bit control signal (ph3), a drain connected to a drain of the second p-type MOSFET transistor (M16) by way of a pair of resistors (R3, R4), a source connected to the source of the first n-type MOSFET transistor (M15), and a body connected to ground,
   wherein a node between the first p-type MOSFET transistor (M14) and the first n-type MOSFET transistor (M15) is connected to a node between the pair of resistors (R3, R4), and the gate voltage is generated at said node.

* * * * *